United States Patent
Akizuki et al.

(10) Patent No.: US 8,836,564 B2
(45) Date of Patent: Sep. 16, 2014

(54) A/D CONVERSION DEVICE

(75) Inventors: Taiji Akizuki, Miyagi (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/814,205

(22) PCT Filed: Mar. 21, 2012

(86) PCT No.: PCT/JP2012/001954
§ 371 (c)(1),
(2), (4) Date: Feb. 4, 2013

(87) PCT Pub. No.: WO2012/132332
PCT Pub. Date: Oct. 4, 2012

(65) Prior Publication Data
US 2013/0127650 A1    May 23, 2013

(30) Foreign Application Priority Data

Mar. 28, 2011   (JP) .................. 2011-070508

(51) Int. Cl.
*H03M 1/12* (2006.01)
*H03M 1/20* (2006.01)

(52) U.S. Cl.
CPC .............. *H03M 1/20* (2013.01); *H03M 1/201* (2013.01)
USPC ............................ 341/155; 341/131; 341/156

(58) Field of Classification Search
CPC ........................................................ H03M 1/20
USPC ................................. 341/131, 155, 156
See application file for complete search history.

(56) References Cited

U.S. PATENT DOCUMENTS

| 4,354,176 A | * | 10/1982 | Aihara | 341/131 |
| 5,825,318 A | * | 10/1998 | Patapoutian et al. | 341/131 |
| 2010/0214141 A1 | * | 8/2010 | Koyama | 341/131 |

FOREIGN PATENT DOCUMENTS

| JP | 60143022 A | 7/1985 |
| JP | 61261928 A | 11/1986 |
| JP | 1-288015 A | 11/1989 |
| JP | 03-185929 A | 8/1991 |
| JP | 6-77343 U | 10/1994 |
| JP | 2000-183741 A | 6/2000 |
| JP | 2000-261316 A | 9/2000 |

OTHER PUBLICATIONS

International Search Report, mailed Jun. 5, 2012, for International Application No. PCT/JP2012/001954, 2 pages.

* cited by examiner

*Primary Examiner* — Jean B Jeanglaude
(74) *Attorney, Agent, or Firm* — Seed IP Law Group PLLC

(57) ABSTRACT

An A/D conversion device generates a control clock signal having a cycle that is an integral multiple of a cycle of a reference clock signal. A shift voltage is generated which varies every cycle of the reference clock signal while the cycle of the control clock signal is taken as one cycle. An analog signal is offset by the shift voltage. The offset analog signal is converted to a digital signal every cycle of the reference clock signal. Outputs from the A/D converter are averaged every cycle of the control clock signal.

9 Claims, 15 Drawing Sheets

A/D CONVERSION DEVICE

TECHNICAL FIELD

The invention relates to an A/D conversion device that converts an analog signal with high resolution through A/D conversion.

BACKGROUND ART

WiGig standards that are wireless communication standards using a millimeter wave band signal employ a modulated signal having a broad band channel width on the order of 1.76 GHz. Further, a modulation scheme adopted in the WiGig standards is a TDD (Time Division Duplex) scheme. Since the minimum duration of a transmission slot is a few microseconds, a modulated signal detection circuit capable of detecting a modulated signal with high accuracy and high resolution even when a transmission operating time is short is of importance.

In order to improve resolution of a digital signal output from the modulated signal detection circuit, what is needed is to use an A/D converter (ADC: A/D converter) having a large number of bits. However, since circuitry of the A/D converter having a large number of bits is complicate, a circuit size and power consumption increase. Against the backdrop, a method for enhancing resolution of a digital signal without changing the number of bits of the A/D converter has long been desired.

FIG. 14 is a block diagram of a related art A/D conversion circuit described in connection with Patent Literature 1. The related art A/D conversion circuit shown in FIG. 14 has a level detection circuit 4 that detects a level of an input signal; reference power sources 3a, 3b, and 3c that output reference voltages having a plurality of different voltage values in a switchable manner by means of an output switch in accordance with a control signal from the level detection circuit 4; and an A/D converter 2 that compares the reference voltages output from the reference power source with an input signal, producing digital outputs.

In the related art A/D conversion circuit, a plurality of comparators that make up the A/D converter 2 compare the plurality of reference voltages output from the reference power sources with an input signal, converting comparison results into digital outputs. When a voltage interval of each of the reference voltages is switched as shown in FIG. 15, the minimum resolution voltage of the A/D converter 2 varies.

The related art A/D conversion circuit detects an amplitude level of the input signal by means of the level detection circuit 4 and switches the reference voltage to be input to the A/D converter 2 to a reference voltage source whose reference voltage has a smaller voltage interval.

As a result of the reference voltage being switched to the reference voltage source, control can be performed in such a way that the input signal closely approximates to the maximum number of bits of the A/D converter 2 and that the A/D converter 2 does not become saturated as the input signal approximates to zero. Accordingly, the related art A/D conversion circuit can enhance the minimum resolution of the A/D converter 2.

However, when detecting a signal of high frequency component which makes up a modulated signal, the related art A/D conversion circuit generates a DC voltage value. On the contrary, when detecting a signal of low frequency component which makes up a modulated signal, the A/D conversion circuit generates an AC voltage value. The modulated signal detection circuit outputs an additional value consisting of the DC voltage value and the AC voltage value.

In the related art A/D conversion circuit, when a level of a modulated signal input to the modulated signal detection circuit becomes higher, a DC value of an average output voltage of the modulated signal detection circuit varies to a greater voltage value in accordance with a detected voltage level of the modulated signal.

As above, as a result of the related art A/D converter being used for A/D conversion of a signal output from the modulated signal detection circuit, the minimum resolution of the A/D converter becomes greater as the voltage level of the modulated signal becomes higher. Namely, there has been a problem of difficulty being encountered in enhancing the minimum resolution of the modulated signal detection circuit over an entire input signal range of the A/D converter.

FIG. 16 is a block diagram of a device in which the minimum resolution of an A/D converter is enhanced over an entire input signal range.

The device shown in FIG. 16 includes a superimposed signal generation circuit that generates a high frequency signal whose frequency is higher than that of an input signal; a reference voltage circuit that generates a criterion reference voltage for an A/D converter (ADC), an addition circuit that adds the reference voltage to the high frequency signal, the A/D converter that compares a reference signal, which is an output of the addition circuit, with an input signal, outputting a digital value; and an averaging filter that eliminates the high frequency signal superimposed on the digital value output from the A/D converter.

The reference signal input to the A/D converter is a signal on which there is superimposed a high frequency signal whose frequency is sufficiently higher than that of the input signal; for instance, a high frequency signal whose frequency component is ten times as high as a frequency of the input signal.

FIG. 17 is a graph showing changes in a relationship between a voltage level of a reference signal and a voltage level of an input signal in the A/D converter shown in FIG. 16. In general, a situation in which an operating frequency of the A/D converter is higher than the frequency of the input signal is called "oversampling."

As mentioned above, the A/D converter compares the input signal on which the high frequency signal is superimposed with a reference signal, outputting a digital value. As shown in FIG. 17, an increase occurs in the number of times the input signal is compared with the reference signal.

A digital value output from the A/D converter is averaged by means of an averaging filter at a predetermined time interval, whereby the averaging filter acquires an output whose bits are larger in number than bits of a digital value output from the A/D converter. Thus, the minimum resolution of the A/D converter can be enhanced over the entire input signal range.

CITATION LIST

Patent Literature

Patent Literature 1: JP-A-61-261928
Patent Literature 2: JP-A-2000-183741

SUMMARY OF INVENTION

Technical Problem

As mentioned above, the device shown in FIG. 16 enables enhancement of minimum resolution over the entire input signal range. However, the device shown in FIG. 16 must activate the A/D converter and the averaging filter in accordance with the operating frequency that is equal to or higher than the frequency component of a harmonic signal output from the superimposed signal generation circuit. However, under operating conditions of the device shown in FIG. 16, the device compatible with wireless communication standards, including the WiGig standards using a millimeter wave band signal, involves an increase in operating frequency of the A/D converter. Hence, the circuit size and power consumption become greater in association with enhancement of operation accuracy.

For instance, a band channel width of the modulated signal employed in the WiGig standards is as broad as 1.76 GHz. For this reason, when a harmonic signal that is 10 times as high as an input signal is generated by the superimposed signal generation circuit, the operating frequency of the A/D converter comes to 17.6 GHz or higher.

The invention aims at providing an A/D conversion device whose digital output resolution is enhanced without changing an operating frequency of an A/D converter and the number of bits of the same and, also, increasing a circuit size and power consumption.

Solution to Problem

According to one aspect of the present invention, there is provided an A/D conversion device comprising:

a control clock generator configured to generate a control clock signal having a cycle that is an integral multiple of a cycle of a reference clock signal;

a shift voltage generator configured to generate a different shift voltage every cycle of the reference clock signal while taking a cycle of the control clock signal as one cycle;

an offset section configured to offset an analog signal by means of the shift voltage;

an A/D converter configured to A/D-convert the offset analog signal every cycle of the reference clock signal; and an averaging section configured to average outputs from the A/D converter every cycle of the control clock signal, wherein the shift voltage varies every cycle of the reference clock signal, while taking a reference shift value as a criterion, such that a total of a value of minimum resolution of an output from the averaging section and a value of an offset between cycles of the reference clock signal of the shift voltage comes to a value of minimum resolution of the A/D converter.

According to another aspect of the present invention, there is provided an A/D conversion device comprising:

a control clock generator configured to generate a control clock signal having a cycle that is an integral multiple of a cycle of a reference clock signal;

a shift voltage generator configured to generate a different shift voltage every cycle of the reference clock signal while taking a cycle of the control clock signal as one cycle;

an A/D converter configured to A/D-convert an analog signal every cycle of the reference clock signal;

an offset section configured to offset a reference voltage utilized by the A/D converter by the shift voltage; and an averaging section configured to average outputs from the A/D converter every cycle of the control clock signal, wherein the shift voltage varies every cycle of the reference clock signal, while taking a reference shift value as a criterion, such that a total of a value of minimum resolution of an output from the averaging section and a value of an offset during a cycle of the reference clock signal of the shift voltage comes to a value of minimum resolution of the A/D converter.

According to still another aspect of the present invention, there is provided an A/D conversion device comprising:

a control clock generator configured to generate a control clock signal having a cycle that is an integral multiple of a cycle of a reference clock signal;

a detector having a detection section configured to detect a modulated signal and an amplifying section configured to amplify a detected signal output from the detection section with a predetermined gain;

an operating condition changing section configured to change the gain of the detector every cycle of the reference clock signal while taking a cycle of the control clock signal as one cycle;

an A/D converter configured to A/D-convert the detected signal every cycle of the reference clock signal; and an averaging section configured to average outputs from the A/D converter every cycle of the control clock signal, wherein a d.c. component of the detected signal resulting from changing of the gain caused by the operating condition changing section varies every cycle of the reference clock signal, while taking a reference value as a criterion, such that a total of a value of minimum resolution of an output from the averaging section and a value of an offset during a cycle of the reference clock signal of the d.c. components of the detected signal comes to a value of minimum resolution of the A/D converter.

Advantageous Effects of Invention

The A/D conversion device of the invention enables enhancement of resolution of a digital output without changing an operating frequency and the number of bits of an AD converter and, also, without increasing a circuit size and power consumption.

DESCRIPTION OF EMBODIMENTS

Embodiments of the invention are hereunder described by reference to the drawings. An A/D conversion device to be described below performs A/D conversion of an analog detected signal which is formed as a result of a high frequency received signal being down-converted to a baseband and, hence, makes a level determination with high resolution. The A/D conversion device is built in a communication device including a cellular phone.

First Embodiment

Figure 1:
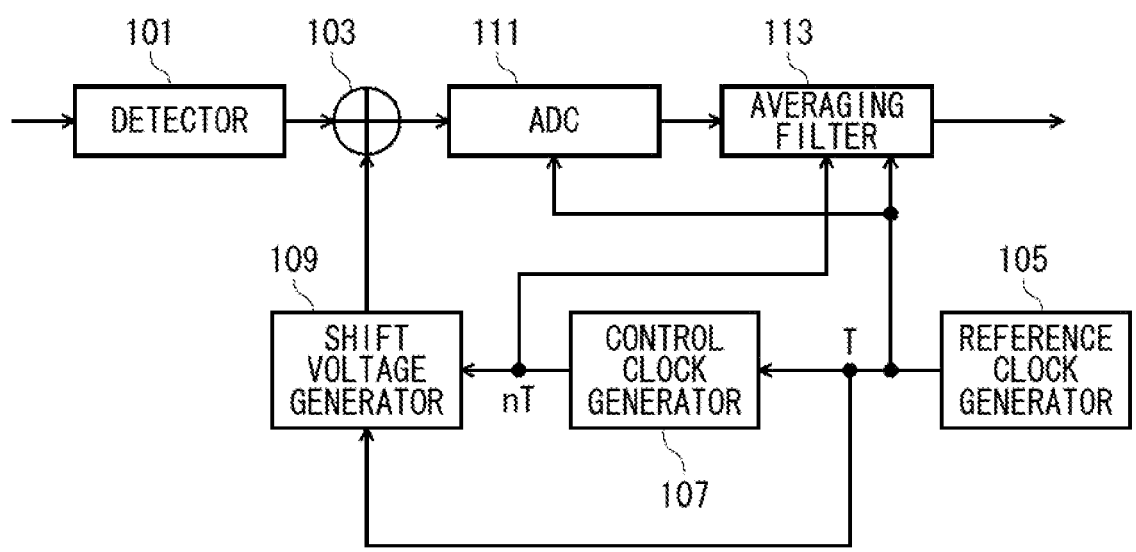
FIG. 1 is a block diagram showing an A/D conversion device of a first embodiment.

FIG. 1 is a block diagram showing an A/D conversion device of a first embodiment. As shown in FIG. 1, the A/D conversion device of the first embodiment includes a detector 101, an adder 103, a reference clock generator 105, a control clock generator 107, a shift voltage generator 109, an A/D converter (ADC: analog-to-digital converter) 111 and an averaging filter 113.

The detector 101 down-converts (performs frequency conversion of) a high frequency modulated signal received by an unillustrated antenna to a baseband. The adder 103 adds a shift voltage generated by the shift voltage generator 109 to a detected signal output by the detector 101, thereby offsetting a voltage level of a detected signal.

The reference clock generator 105 generates an operation clock signal for the ADC 111 and the averaging filter 113. An operation clock is called a "reference clock" having a cycle T in the following descriptions. In addition to the ADC 111 and the averaging filter 113, the reference clock signal generated by the reference clock generator 105 is input to the shift voltage generator 109 and the control clock generator 107.

The control clock generator 107 generates a control clock signal having a cycle nT (hereinafter called a "control cycle") that is an "n" multiple of a cycle T (hereinafter called a "reference cycle") of the reference clock signal generated by the reference clock generator 105, where "n" is an integer of two or more (n≥2). The control clock signal generated by the control clock generator 107 is input to the shift voltage generator 109 and the averaging filter 113.

The shift voltage generator 109 generates a shift voltage that changes a voltage level of a DC component of a detected signal output from the detector 101.

The control cycle nT of the shift voltage corresponds to one cycle. A value of the shift voltage varies from one reference cycle T to another.

A value that is achieved in a predetermined reference cycle (a reference shift value Vsth) belonging to the control cycle nT is used as a reference in connection with the value of the shift voltage.

A value resulting from addition of a predetermined offset value to or subtraction of the same from the reference shift value Vsth is used outside the predetermined reference cycle.

The predetermined offset value is (n−1)/n×LSB, where 1LSB is a minimum resolution voltage of the ADC 111. The reference shift value Vsth can also be zero.

Figure 2:
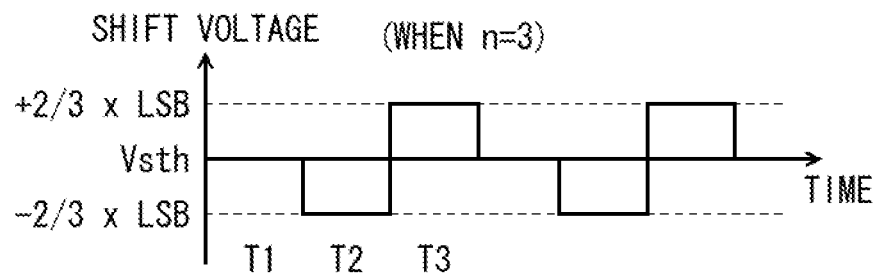
FIG. 2 is a graph showing a shift voltage that is generated by a shift voltage generator 109.

FIG. 2 is a graph showing a shift voltage generated by the shift voltage generator 109. As shown in FIG. 2, the shift voltage generator 109 takes a control cycle 3T as one cycle in a cycle of n=3. In a first reference cycle T1, the shift voltage generator 109 generates a shift voltage having a reference shift value Vsth. In a subsequent reference cycle T2, the shift voltage generator 109 generates a shift voltage of Vsth+⅔×LSB. In a final reference cycle T3, the shift voltage generator 109 generates a shift voltage of Vsth−⅔×LSB.

The ADC 111 converts a voltage level of an analog signal output from the adder 103; in other words, a detected signal having an offset voltage level, into a digital value every cycle T of the reference clock signal. The ADC 111 has a plurality of comparators, and each of the comparators compares a reference voltage with the voltage level of the analog signal, outputting a result commensurate with a magnitude of the voltage level.

Figure 3:
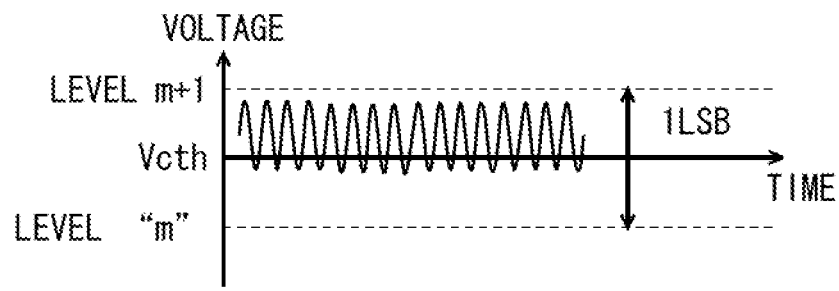
FIG. 3 is a chart showing a relationship between an example of a signal that is generated by adding a reference shift value Vsth to a detected signal output from a detector 101 and levels indicated by digital values which an ADC 111 can convert.

FIG. 3 is a chart showing a relationship between an example of a signal (designated by a solid line) that is generated by adding the reference shift value Vsth to a detected signal output from the detector 101 and levels (m+1, m: designated by broken lines) indicated by a digital value which the ADC 111 can convert. The signal corresponds to the reference cycle T1 shown in FIG. 2.

When the signal shown in FIG. 3 is input to the ADC 111, the ADC 111 outputs a digital value representing an m+1-level voltage because an average voltage of signals which are generated by adding the reference shift value Vsth to detected signals is higher than the reference voltage Vcth.

The reference voltage Vcth is a reference value for determining whether or not the signal input to the ADC 111 is a level "m" or a level "m+1."

Figure 4:
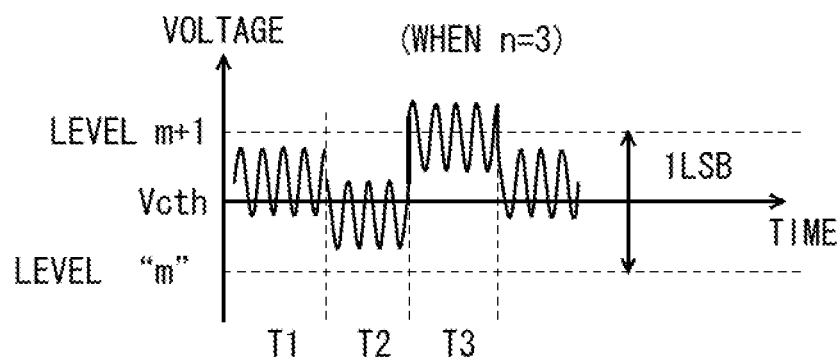
FIG. 4 is a chart showing a relationship between an example of a signal that is generated by adding a shift voltage to the detected signal output from the detector 101 and levels indicated by the digital values which the ADC 111 can convert.

FIG. 4 is a chart showing a relationship between an example of a signal that is generated by adding a shift voltage ⅔×LSB to or subtracting the same from the detected signal output from the detector 101 and levels indicated by digital values which the ADC 111 can convert.

A graph shown in FIG. 4 shows a relationship achieved in a cycle of n=3. As shown in FIG. 4, a signal that is generated by adding the shift voltage shown in FIG. 2 to the detected signal output from the detector 101 is input to the ADC 111. In the reference cycle T1, the shift, voltage ⅔×LSB is not added or subtracted. In the reference cycle T2, the shift voltage ⅔×LSB is subtracted. In the reference cycle T3, the shift voltage ⅔×LSB is added.

In the reference cycles T1 and T3, the ADC 111 outputs a digital value representing an m+1-level voltage because an average voltage of input signals is higher than the reference voltage Vcth. Since the average voltage of the input signals is lower than the reference voltage Vcth in the reference cycle T2, a digital value representing an m-level voltage is output.

Even in a cycle other than the cycle of n=3, the voltage of the detected signal can be identified with resolution of LSB/n or less.

A shift voltage of ±(n−1)/n×LSB is added to a detected signal. Hence, a signal that is higher than the reference voltage Vcth by LSB/n or more comes to a value of LSB/n+Vsth+(n−1)/n×LSB or more; namely, Vsth+1, in the reference cycle during which the shift voltage of Vsth+(n−1)/n×LSB is added. Accordingly, the signal assumes level m+1.

Since the signal assumes the level "m" in the other reference cycles, the digital value output from the averaging filter 113 in the control cycle nT assumes level m+1/n. Likewise, a signal that is lower than the reference voltage Vcth by LSB/n or more assumes the level m−1 in the reference cycle in which the shift voltage Vsth−(n−1)/n×LSB is added. The signal assumes the level "m" in the other reference cycles. Hence, the digital value output from the averaging filter 113 in the control cycle nT is level m−1/n.

In the control cycle nT, the averaging filter 113 averages the digital values output from the ADC 111 in synchronism with the ADC 111 by means of the reference clock signal. The averaging filter 113 outputs an average value represented by bits that are greater in number than bits representing the digital values output from the ADC 111.

In the example shown in FIG. 4, for instance, levels output from the ADC 111 within the control cycle 3T include one level m+1 and two levels "m." Therefore, the averaging filter 113 outputs, as an average value, a digital value representing an m+⅓-level voltage. Given that the levels output from the ADC 111 in the control cycle 3T include two levels m+1 and one level "m," the averaging filter 113 outputs, as an average value, a digital value representing an m+⅔-level voltage.

In the example shown in FIG. 4, in response to the output from the ADC 111 having the level "m" or m+1, the averaging filter 113 outputs a digital value representing the level "m", the level m+⅓, the level m+⅔, or the level m+1. Specifically, the minimum resolution of the averaging filter 113 is one-third of the minimum resolution of the ADC 111. In the embodiment, a digital output with resolution that is "n" times as high as that of 1LSB of the ADC 111 can be obtained without changing the operating frequency of the ADC 111 and the number of bits. In the embodiment, an offset value ((n−1)/n×LSB) during a reference cycle of the shift voltage is set in such a way that a total of a value of minimum resolution (LSB/n) of the averaging filter 113 and an offset value ((n−1)/n×LSB) of the reference cycles of the shift voltage of the shift voltage generator 109 comes to a value of minimum resolution (LSB) of the ADC 111.

Figure 5:
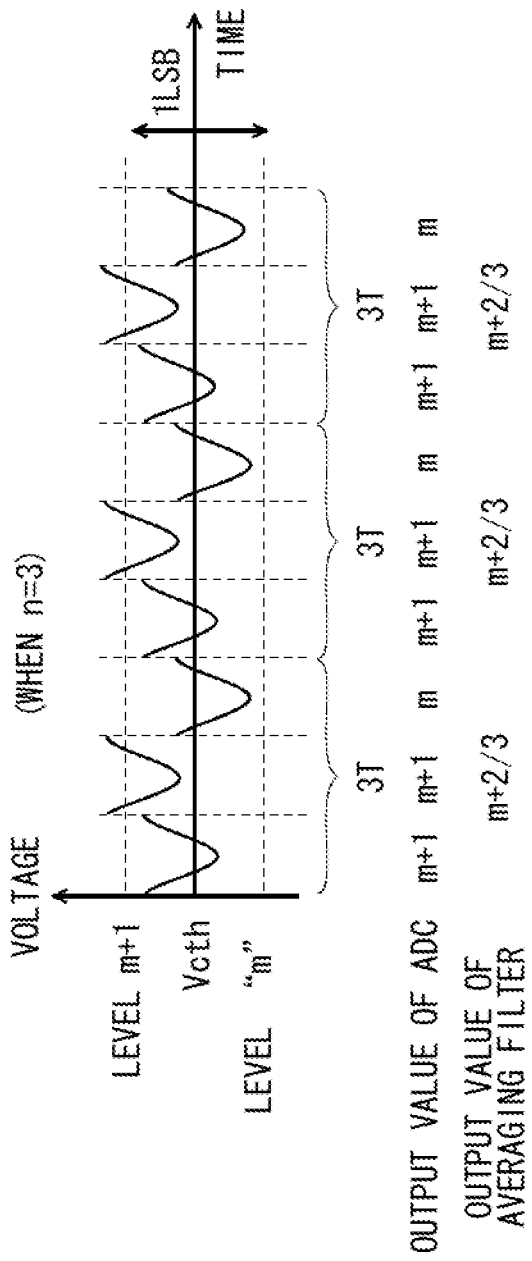
FIG. 5 is a chart showing an example of a signal that is generated by adding a shift voltage to a detected signal whose frequency is an integral multiple of 1/nT.

Now, suppose that the value "n" is a fixed value, that the detected signal is a constant sinusoidal wave, and that a frequency of the detected signal is an integral multiple of 1/nT, digital values output from the averaging filter 113 in the respective control cycles are equal as shown in FIG. 5.

Figure 6:
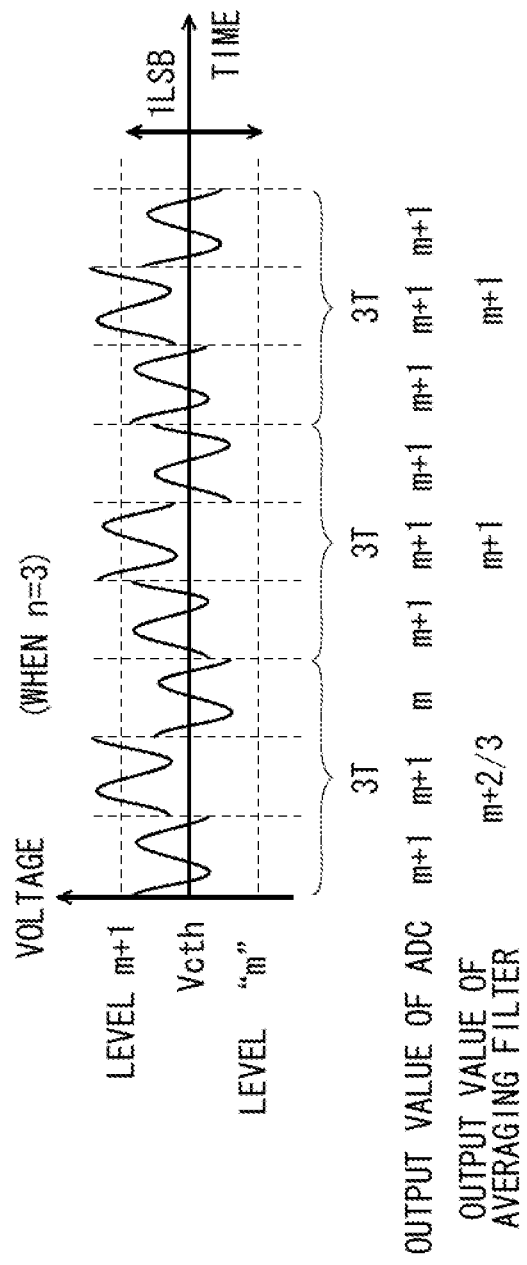
FIG. 6 is a chart showing an example of a signal that is generated by adding a shift voltage to a detected signal whose frequency is not an integral multiple of 1/nT.

When the frequency of the detected signal output from the detector 101 is not an integral multiple of 1/nT, however, signals input to the ADC 111 during the respective reference cycles have different phases, respectively, as shown in FIG. 6. For this reason, the digital values output from the averaging filter 113 might vary in periods of the control cycles.

Consequently, the control clock generator 107 can randomly switch the value "n." Specifically, the above-described value "n" is not restricted to the fixed value but can also be a variable value. For this reason, a digital output having an averaged variation can be generated among frequency components of the detected signal.

When the value "n" is set to a fixed value, the reference clock generator 105 can change the reference cycle T such that an integral multiple of 1/nT becomes equal to the frequency of the detected signal.

In the embodiment, as shown in FIG. 2, the shift voltage generator 109 generates a specific shift voltage in response to a sequence of the reference cycles within the control cycle. Specifically, the shift voltage is regularly changed on a per-reference-cycle basis within the control cycle. However, in another mode of the embodiment, the shift voltage generator 109 can also randomly change the shift voltage on a per-reference-cycle basis within the control cycle.

The shift voltage generator 109 inevitably generates one of three types of shift voltages (Vsth, Vsth+(n−1)/n×LSB, Vsth−(n−1)/n×LSB) in one control cycle.

In the embodiment, the shift voltage generator 109 generates a shift voltage having a value that is obtained by adding or subtracting a predetermined offset value (n−1)/n×LSB to or from the reference shift value Vsth.

Figure 7:
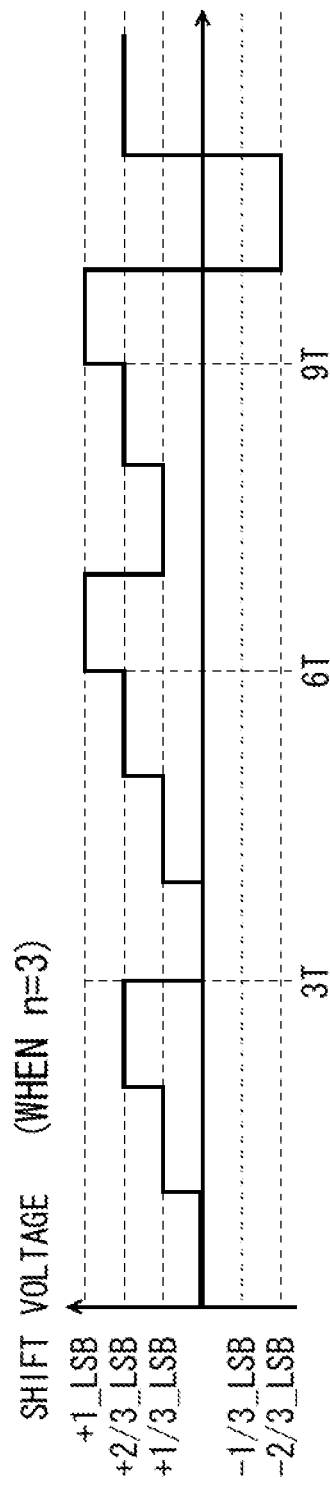
FIG. 7 is a chart showing random variations of a randomly generated shift voltage.

However, as shown in FIG. 7, in the other mode of the embodiment, the shift voltage generator 109 can randomly generate any one of shift voltages Vsth+1LSB, Vsth±(n−1)/n×LSB, Vsth±(n−2)/n×LSB, . . . Vsth±1/n×LSB.

Even when the detected signal is a regular signal, the shift voltage to be added or subtracted changes every control cycle nT by making the value of the shift voltage random. For this reason, the accuracy of resolution of 1LSB or less can be enhanced.

Figure 8:
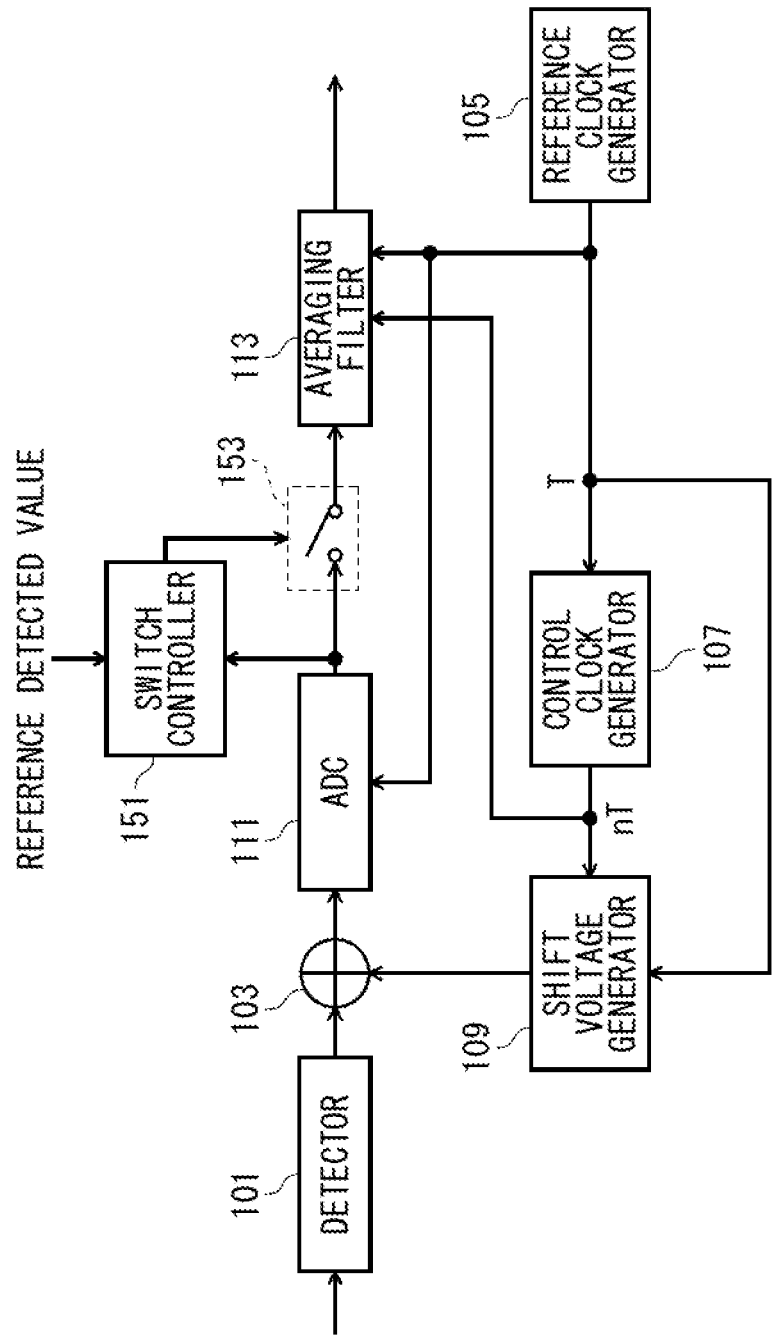
FIG. 8 is a block diagram showing an A/D conversion device of another type of the embodiment.

As shown in FIG. 8, a switch 153 is interposed between the ADC 111 and the averaging filter 113. There can also be additionally provided a switch controller 151 that controls the switch 153 in accordance with a result of comparison between a value of an output from the ADC 111 and the reference detected value.

The configuration shown in FIG. 8 can be employed in a case where a modulation scheme of the A/D conversion device is a TDD scheme and where a value of a digital output from the A/D converter is not stable because it is in a state of a transient response in a time segment during which a time delay exists in a rise of a modulated signal.

In the A/D conversion device shown in FIG. 8, the switch controller 151 compares a value of an output from the ADC 111 with the reference detected value, controlling the switch 153 such that the outputs from the ADC 111 are not subjected to averaging in the averaging filter 113 until the output value falls within a range of predetermined error with reference to a reference detected value.

As a consequence, signals input to the averaging filter 113 at a rise of the modulated signal can be limited to a range of a predetermined error. Hence, a convergence time of an output value from the averaging filter 113 can be shortened.

When the averaging filter 113 generates an output value from information about all input signals as does an IIR filter, processing is carried out along procedures provided below.

Before a modulated signal is input to the detector 101, the averaging filter 113 inputs data pertaining to a target value, or an amount of data used for stabilizing an output value, in advance, thereby shortening a convergence time of an output value to a much greater extent.

Second Embodiment

Figure 9:
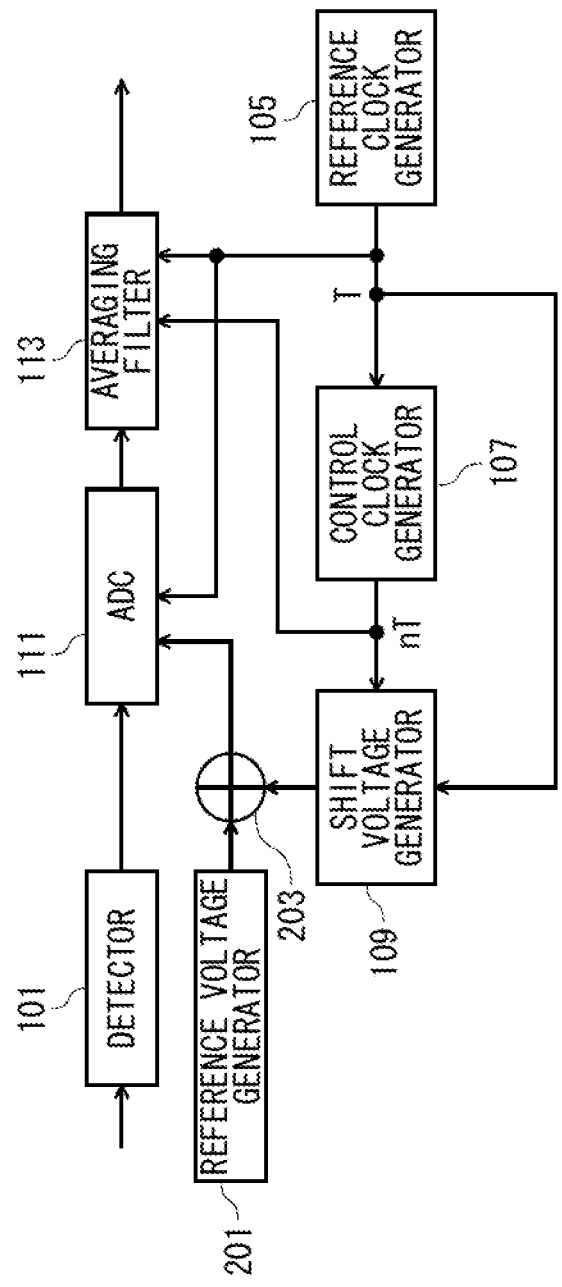
FIG. 9 is a block diagram showing an A/D conversion device of a second embodiment.

FIG. 9 is a block diagram showing an A/D conversion device of a second embodiment.

In the A/D conversion device of the first embodiment, the adder 103 must be high precision in order to add a shift voltage to a detected signal.

In contrast, the A/D conversion device of the second embodiment has a reference voltage generator 201 and an adder 203, and a shift voltage similar to that described in connection with the first embodiment is added to a reference voltage used in each of the comparators of the ADC 111.

The A/D conversion device is similar to that described in connection with the first embodiment except the reference voltage generator 201 and the adder 203 shown in FIG. 9. In FIG. 9, parts that are identical with or equivalent to those of the A/D conversion device of the first embodiment shown in FIG. 1 are assigned the same or corresponding reference numerals, and their repeated explanations are simplified or omitted.

The voltages (the shift voltage and the reference voltage) added by the adder 203 of the embodiment each assume a form of a DC value. Therefore, the adder 203 that is simpler than its counterpart descried in connection with the first embodiment can be used. A circuit size of the A/D conversion device becomes smaller, and power consumption of the same can also be reduced.

The ADC 111 compares a signal (a detected signal) output from the detector 101 with each of the reference voltages, outputting a digital value. Therefore, in the first embodiment, a digital output of the ADC 111 which is obtained by adding the voltage Vshift (V) to the output from the detector 101 becomes equal to the digital value of the ADC 111 which is obtained by adding a −Vshift (V) voltage to each of the reference voltages in the second embodiment.

For these reasons, the first embodiment and the second embodiment yield the same improvement effect pertaining to resolution of the output from the averaging filter 113. In the embodiment, the A/D conversion device can also be equipped with the switch 153 and the switch controller 151 described by reference to FIG. 8.

Third Embodiment

Figure 10:
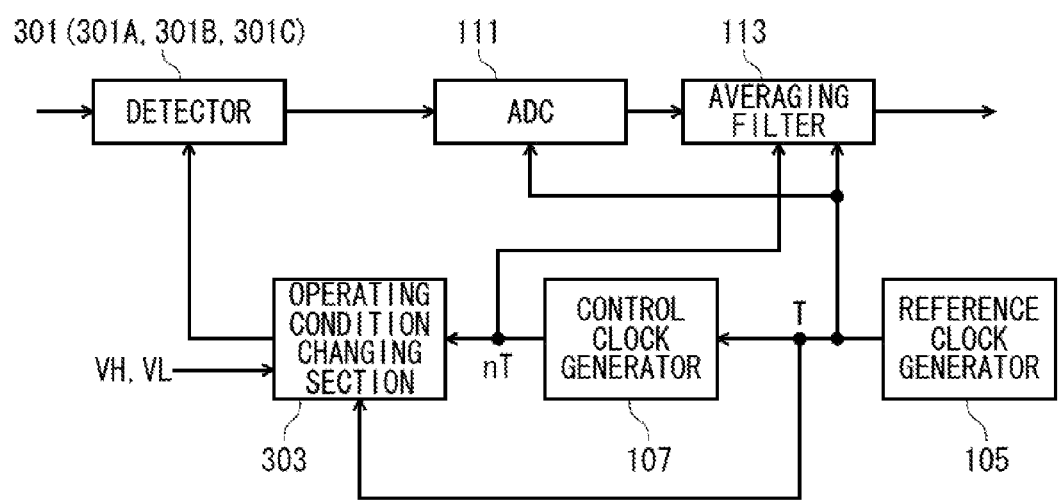
FIG. 10 is a block diagram showing an A/D conversion device of a third embodiment.

FIG. 10 is a block diagram showing an A/D conversion device of a third embodiment.

In the A/D conversion device of the third embodiment, a signal output from an operating condition changing section 303 is input to a detector 301. A gain of the detector 301 is set by means of an externally-input control voltage VH and a negative offset voltage value is set by means of an externally-input control voltage VL in such a way that a DC value of a signal which is output from the detector 301 and input to the ADC 111 becomes identical with or substantially equal to a DC value of the output from the adder 103 of the first embodiment.

The A/D conversion device of the third embodiment differs from the A/D conversion device of the first embodiment in that an offset of the detected signal is controlled by means of a voltage from the operating condition changing section 303 without use of the adder 103.

Constituent elements shown in FIG. 10 are analogous to their counterparts described in connection with the first embodiment except the detector 301 and the operating condition changing section 303. Parts that are identical with or equivalent to those of the A/D conversion device of the first embodiment shown in FIG. 1 are assigned the same or corresponding reference numerals, and their repeated explanations are simplified or omitted.

Figure 11:
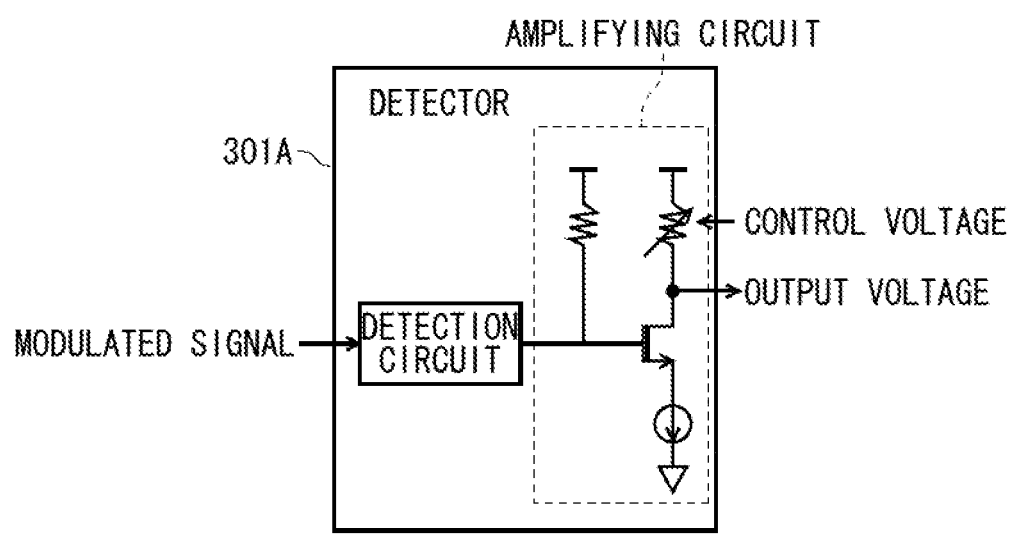
FIG. 11 is a diagram showing an example of an internal configuration of a detector 301A that offsets a detected signal in accordance with a control voltage from an operating condition changing section 303.
Figure 12:
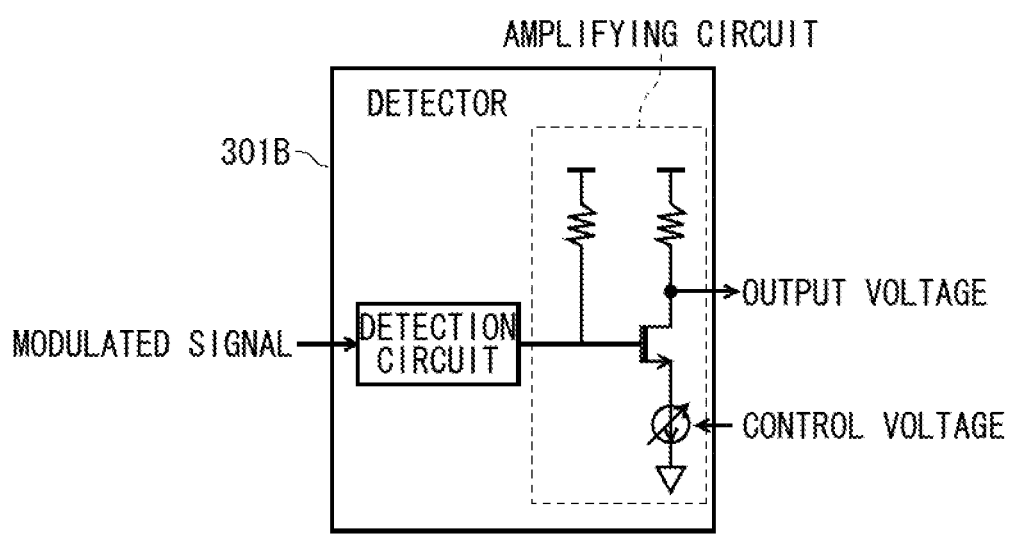
FIG. 12 is a diagram showing an example of an internal configuration of a detector 301B that offsets a detected signal in accordance with a control voltage from the operating condition changing section 303.
Figure 13:
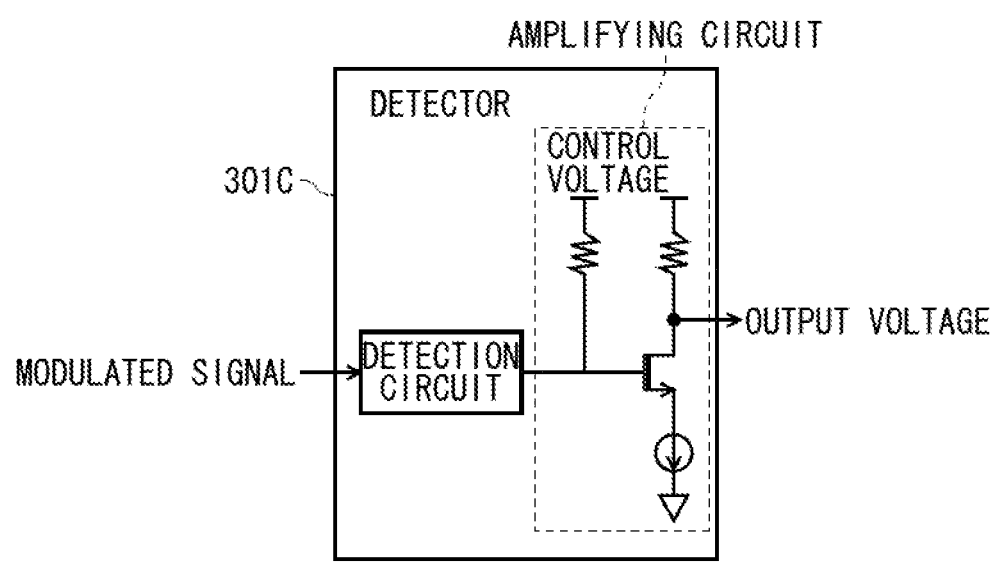
FIG. 13 is a diagram showing an example of an internal configuration of a detector 301C that offsets a detected signal in accordance with a control voltage from the operating condition changing section 303.
Figure 14:
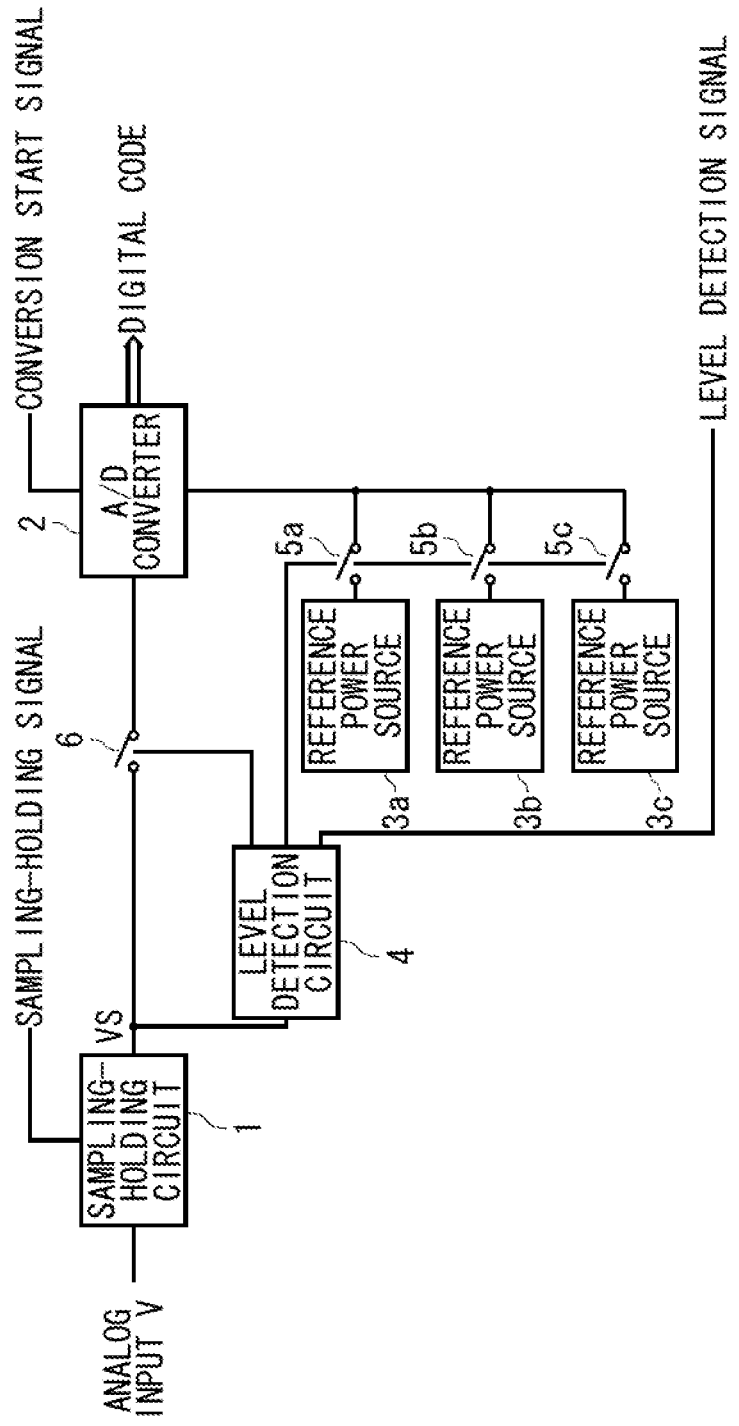
FIG. 14 is a block diagram of an A/D conversion circuit described in connection with Patent Literature 1.
Figure 15:
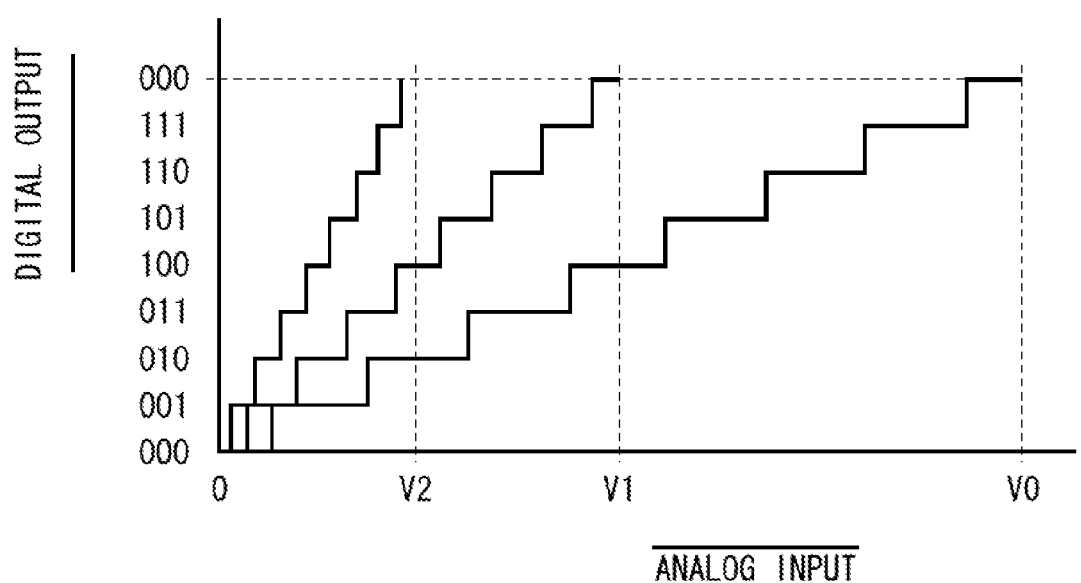
FIG. 15 is a diagram showing a relationship between an input and an output of the A/D conversion circuit shown in FIG. 14.
Figure 16:
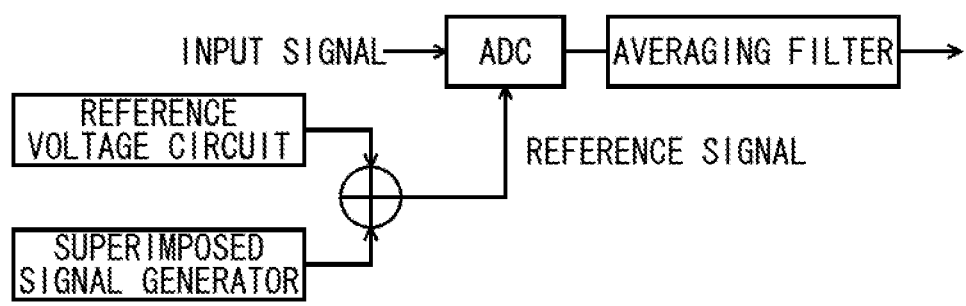
FIG. 16 is a block diagram of a device in which minimum resolution of the A/D converter is enhanced over an entire input signal range.
Figure 17:
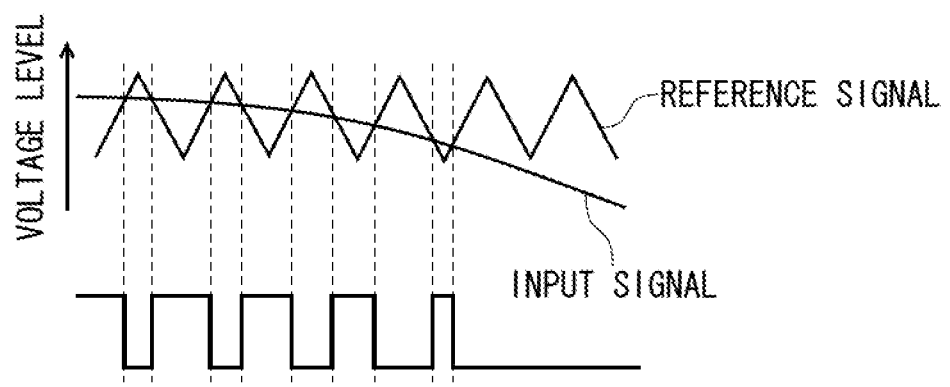
FIG. 17 is a graph showing a change in relationship between a voltage level of a reference signal and a voltage level of an input signal in the A/D converter shown in FIG. 16.

FIGS. 11 through 13 are diagrams showing an example of an internal configuration of the detector 301 that offsets a detected signal in accordance with a voltage from the operating condition changing section 303. A detector 301A shown in FIG. 11 has a detecting circuit for detecting a modulated signal and an amplifying circuit for amplifying an output from the detecting circuit by means of a predetermined gain. The detector 301A adjusts an output load on the amplifying circuit by means of a control voltage from the operating condition changing section 303, so that there can be output a signal which is identical with the output of the adder 103 of the first embodiment in terms of an output amplitude, a duty ratio, and a cycle.

In order to vary the output load of the amplifying circuit, an offset can be changed by means of a control voltage provided that settings are made so as to switch the operating condition changing section 303 to the transistor while taking a MOS transistor as the load and while a gate bias voltage of the MOS transistor is taken as a control voltage.

Suppose that the load is made by use of a resistor and a switch and that the switch is turned on/off by means of the control voltage from the operating condition changing section 303, the output load of the amplifying circuit can be easily changed.

A detector 301B shown in FIG. 12 regulates a value of a power source of a buffer rather than the output load, by means of the control voltage from the operating condition changing section 303. Suppose that the power source is embodied by a MOS transistor and that the gate bias value of the MOS transistor is controlled as the control voltage from the operating condition changing section 303, whereby a value of a d.c. current flowing through the output load is switched.

A detector 301C shown in FIG. 13 switches the gate bias value of the transistor in the amplifying circuit as a value of a control voltage from the operating condition changing section 303. Therefore, the electric current flowing through the load resistor of the amplifying circuit can be controlled by means of the gate bias value, and the gain of the output signal can be controlled by means of the control voltage from the operating condition changing section 303.

As described above, as opposed to the first embodiment, the high precision adder that adds a shift voltage to a detected signal is obviated in the embodiment. Hence, the circuit size of the A/D conversion device becomes smaller, and power consumption can be reduced. Incidentally, in the embodiment, the switch 153 and the switch controller 151 described by reference to FIG. 8 can also be provided.

While the present invention has been described in detail, or with reference to the specific embodiments, it is apparent for those skilled in the art that the invention may be modified and changed in various manners without departing from the scope and spirit of the invention.

This application is based on Japanese Patent Application (Japanese Patent Application No. 2011-070508) filed on Mar. 28, 2011, the disclosure of which is incorporated herein by reference in its entirety.

INDUSTRIAL APPLICABILITY

The A/D conversion device of the invention is useful as an A/D conversion device that A/D-converts an analog signal with high resolution.

REFERENCE SIGNS LIST 101, 301, 301A, 301B 301C DETECTOR
103, 203 ADDER
105 REFERENCE CLOCK GENERATOR
107 CONTROL CLOCK GENERATOR
109 SHIFT VOLTAGE GENERATOR
111 A/D CONVERTER (ADC)
113 AVERAGING FILTER

151 SWITCH CONTROLLER
153 SWITCH
201 REFERENCE VOLTAGE GENERATOR
303 OPERATING CONDITION CHANGING SECTION

The invention claimed is:

1. An A/D conversion device comprising:
   a control clock generator, which, in operation, generates a control clock signal having a cycle that is an integral multiple of a cycle of a reference clock signal;
   a shift voltage generator, which, in operation, generates a different shift voltage every cycle of the reference clock signal while taking a cycle of the control clock signal as one cycle;
   an offset section, which, in operation, offsets an analog signal based on a shift voltage generated by the shift voltage generator;
   an A/D converter, which, in operation, converts the offset analog signal to a digital signal every cycle of the reference clock signal;
   an averaging section, which, in operation, averages outputs from the A/D converter every cycle of the control clock signal;
   a switch, which, in operation, opens and closes a channel between the A/D converter and the averaging section; and
   a switch controller, which, in operation, controls the switch in accordance with a result of a comparison between a value output from the A/D converter and a reference value, wherein the switch controller controls the switch so as to close the channel when the value output from the A/D converter falls within a determined error range with reference to the reference value, wherein
   the shift voltage varies every cycle of the reference clock signal, while taking a reference shift value as a criterion, such that a total of a value of minimum resolution of an output from the averaging section and a value of an offset between cycles of the reference clock signal of the shift voltage comes to a value of minimum resolution of the A/D converter.

2. The A/D conversion device according to claim 1, further comprising:
   a detector, which, in operation, frequency-converts a high frequency modulated signal received by an antenna into a baseband, wherein
   a carrier frequency of the received high frequency modulated signal is a frequency that is "n" times as high as an output frequency of the reference clock signal.

3. The A/D conversion device according to claim 1, wherein, when "n" is a positive integer, the offset value is a value that is an (n−1)/n multiple of the minimum resolution of the A/D converter.

4. An A/D conversion device comprising:
   a control clock generator, which, in operation, generates a control clock signal having a cycle that is an integral multiple of a cycle of a reference clock signal;
   a shift voltage generator, which, in operation, generates a different shift voltage every cycle of the reference clock signal while taking a cycle of the control clock signal as one cycle;
   an A/D converter, which, in operation, converts an analog signal into a digital signal every cycle of the reference clock signal;
   an offset section, which, in operation, offsets, by a shift voltage generated by the shift voltage generator, a reference voltage utilized by the A/D converter;
   an averaging section, which, in operation, averages outputs from the A/D converter every cycle of the control clock signal
   a switch, which, in operation, opens and closes a channel between the A/D converter and the averaging section;
   a switch controller, which, in operation, controls the switch in accordance with a result of a comparison between a value output from the A/D converter and a reference value, wherein the switch controller controls the switch so as to close the channel when the value output from the A/D converter falls within a determined error range with reference to the reference value, wherein
   the shift voltage varies every cycle of the reference clock signal, while taking a reference shift value as a criterion, such that a total of a value of minimum resolution of an output from the averaging section and a value of an offset during a cycle of the reference clock signal of the shift voltage comes to a value of minimum resolution of the A/D converter.

5. The A/D conversion device according to claim 4, wherein, when "n" is a positive integer, the offset value is a value that is an (n−1)/n multiple of the minimum resolution of the A/D converter.

6. The A/D conversion device according to claim 4, further comprising:
   a detector, which, in operation, frequency-converts a high frequency modulated signal received by an antenna into a baseband, wherein
   a carrier frequency of the received high frequency modulated signal is a frequency that is "n" times as high as an output frequency of the reference clock signal.

7. An A/D conversion device comprising:
   a control clock generator, which, in operation, generates a control clock signal having a cycle that is an integral multiple of a cycle of a reference clock signal;
   a detector having a detection section, which, in operation, detects a modulated signal and an amplifying section, which, in operation, amplifies a detected signal output from the detection section with a determined gain;
   an operating condition changing section, which, in operation, changes the gain of the detector every cycle of the reference clock signal while taking a cycle of the control clock signal as one cycle;
   an A/D converter, which, in operation, converts the detected signal every cycle of the reference clock signal; and
   an averaging section, which, in operation, averages outputs from the A/D converter every cycle of the control clock signal, wherein
   a direct-current component of the detected signal resulting from changing of the gain caused by the operating condition changing section varies every cycle of the reference clock signal, while taking a reference value as a criterion, such that a total of a value of minimum resolution of an output from the averaging section and a value of an offset during a cycle of the reference clock signal of the direct current components of the detected signal comes to a value of minimum resolution of the A/D converter.

8. The A/D conversion device according to claim 4, comprising:
   a switch, which, in operation, opens and closes a channel between the A/D converter and the averaging section; and a switch controller, which, in operation, controls the switch in accordance with a result of a comparison between a value output from the A/D converter and a reference value, wherein the switch controller controls the switch so as to close the channel when the value output from the A/D converter falls within a determined error range with reference to the reference value.

9. The A/D conversion device according to claim 4, wherein the detector, in operation, frequency-converts a high frequency modulated signal received by an antenna into a baseband, and a carrier frequency of the received high frequency modulated signal is a frequency that is "n" times as high as an output frequency of the reference clock signal.

* * * * *